United States Patent
Wang

(10) Patent No.: US 10,825,838 B2
(45) Date of Patent: Nov. 3, 2020

(54) ARRAY SUBSTRATE AND ITS MANUFACTURING METHOD AND DISPLAY DEVICE

(71) Applicant: Wuhan China Star Optoelectronics Technology Co., Ltd., Wuhan (CN)

(72) Inventor: Chuan Wang, Shenzhen (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 99 days.

(21) Appl. No.: 16/170,050

(22) Filed: Oct. 25, 2018

(65) Prior Publication Data

US 2019/0305007 A1 Oct. 3, 2019

Related U.S. Application Data

(63) Continuation of application No. PCT/CN2018/101633, filed on Aug. 22, 2018.

(30) Foreign Application Priority Data

Mar. 29, 2018 (CN) .......................... 2018 1 0271528

(51) Int. Cl.
*H01L 27/12* (2006.01)

(52) U.S. Cl.
CPC ...... *H01L 27/1218* (2013.01); *H01L 27/1262* (2013.01)

(58) Field of Classification Search
None
See application file for complete search history.

(56) References Cited

U.S. PATENT DOCUMENTS

| 2014/0175434 A1 | 6/2014 | Yuan |
| 2016/0294386 A1 | 10/2016 | Yang et al. |
| 2017/0090229 A1* | 3/2017 | Imai ................. G02F 1/136286 |
| 2017/0117302 A1 | 4/2017 | Zhang |
| 2018/0217458 A1 | 8/2018 | Xie |

* cited by examiner

*Primary Examiner* — Raj R Gupta

(57) ABSTRACT

The present disclosure provides an array substrate, a manufacturing method thereof and a display. By forming a source pattern layer on the base substrate in the present disclosure, the source pattern layer crossing the gate pattern layer maybe mutually insulated from the gate pattern layer through the insulating buffer layer, thus eliminating the dielectric layer in the prior art which is formed to insulate the source pattern layer and the gate pattern layer, further simplifying the structure of the array substrate, and reducing the process steps and process costs.

14 Claims, 3 Drawing Sheets

ARRAY SUBSTRATE AND ITS MANUFACTURING METHOD AND DISPLAY DEVICE

CROSS-REFERENCE TO RELATED APPLICATIONS

The present application is a continuation-application conversion of International (PCT) Patent Application No. PCT/CN2018/101633 filed on Aug. 22, 2018, which claims foreign priority of Chinese Patent Application No. 201810271528.0, filed on Mar. 29, 2018 in the State Intellectual Property Office of China, the contents of all of which are hereby incorporated by reference.

TECHNICAL FIELD

The present disclosure relates to the field of display technologies, and in particular, to an array substrate, a manufacturing method thereof, and a display device.

BACKGROUND

A thin film transistor in an array substrate consists of a plurality of film layers combined with each other, which are provided with different functions and different materials, and a source electrode and a gate electrode of the thin film transistor are disposed at different layers and cross each other. Therefore, in order to insulate the position where the source electrode and the gate electrode cross each other, an insulating dielectric layer needs to be configured between the source electrode and the drain electrode. Therefore, when manufacturing the array substrate, it is needed to add the process of forming the dielectric layer.

SUMMARY

The present disclosure mainly provides an array substrate, a manufacturing method thereof and a display device, aiming at solving the problem of adding the process of forming a dielectric layer in order to insulate the source electrode and the gate electrode from each other.

In order to solve the above technical problem, one of the technical solutions in the present disclosure is to provide a display device, and the display device including an array substrate. The array substrate including: a base substrate, and a source pattern layer and a light shielding layer formed on the base substrate; a buffer layer covering the source pattern layer, the buffer layer defining a first via hole through which the source pattern layer is exposed; a semiconductor pattern layer formed on the buffer layer, the semiconductor pattern layer disposed corresponding to the light shielding layer, a gate insulating layer covering the semiconductor pattern layer, the gate insulating layer defining a second via hole and a third via hole, one end of the semiconductor pattern layer exposed through the second via hole, the third via hole connected to the first via hole, and the other end of the semiconductor pattern layer exposed through the third via hole; a gate pattern layer, a drain pattern layer, and a connection pattern layer formed on the gate insulating layer, the drain pattern layer connected to one end of the semiconductor pattern layer through the second via hole, the connection pattern layer filled in the first via hole and the third via hole to connect the source pattern layer with the other end of the semiconductor pattern layer; and a protective layer, a planar layer, and a pixel electrode layer, which are sequentially formed, the protective layer and the planar layer defining a fourth via hole through which the drain pattern layer is exposed, the fourth via hole connected with the second via hole, and the pixel electrode layer connected to the drain pattern layer through the fourth via hole.

In order to solve the above technical problem, another technical solution in the present disclosure is to provide an array substrate. The array substrate including: a base substrate, and a source pattern layer formed on the base substrate; a buffer layer covering the source pattern layer, the buffer layer defining a first via hole through which the source pattern layer is exposed; a semiconductor pattern layer formed on the buffer layer; a gate insulating layer covering the semiconductor pattern layer, the gate insulating layer defining a second via hole and a third via hole, one end of the semiconductor pattern layer exposed through the second via hole, the third via hole connected to the first via hole, and the other end of the semiconductor pattern layer exposed through the third via hole; and a gate pattern layer, a drain pattern layer, and a connection pattern layer formed on the gate insulating layer, the drain pattern layer connected to one end of the semiconductor pattern layer through the second via hole, the connection pattern layer filled in the first via hole and the third via hole to connect the source pattern layer with the other end of the semiconductor pattern layer.

In order to solve the above technical problem, another technical solution in the present disclosure is to provide a manufacturing method of an array substrate. The method including: providing a base substrate and forming a source pattern layer on the base substrate; forming a buffer layer covering the source pattern layer, the buffer layer defining a first via hole through which the source pattern layer is exposed; forming a semiconductor pattern layer on the buffer layer; forming a gate insulating layer covering the semiconductor pattern layer, the gate insulating layer defining a second via hole and a third via hole, one end of the semiconductor pattern layer exposed through the second via hole, the third via hole connected to the first via hole, and the other end of the semiconductor pattern layer exposed through the third via hole; and forming a gate pattern layer, a drain pattern layer and a connection pattern layer on the gate insulating layer, the drain pattern layer connected to one end of the semiconductor layer through the second via hole, the connection pattern layer filled into the first via hole and the third via hole to connect the source pattern layer with the other end of the semiconductor pattern layer.

The effects of the present disclosure lies in that, differing from the prior art, in the present disclosure, with a source pattern layer formed on a base substrate, and through the connection pattern layer filled in the first via hole of the buffer layer and the third via hole of the gate insulating layer, the source pattern layer may be connected with a semiconductor pattern layer disposed on the buffer layer, such that the source pattern layer crossing the gate pattern layer may be insulated from the gate pattern layer through the insulating buffer layer, in which case, the dielectric layer in the prior art which is formed to insulate the source pattern layer and the gate pattern layer, may be eliminated, thus simplifying the structure of the array substrate, and reducing the process steps and process costs.

BRIEF DESCRIPTION OF THE DRAWINGS

In order to more clearly illustrate the technical solutions in the embodiments of the present disclosure, the drawings referred in the description of the embodiments will be briefly described below. Obviously, the drawings in the following description are merely some of the present disclosure. For the skilled in the art, other drawings based on these drawings may also be obtained without any creative effort.

DETAILED DESCRIPTION

The technical solution in the embodiments of the present disclosure will be clearly and completely described below with reference to the accompanying drawings in the embodiments of the present disclosure. Obviously, the described embodiments are merely a part of the embodiments of the present disclosure, not all of the embodiments. All other embodiments obtained by one with ordinary skills in the art based on the embodiments of the present disclosure without any creative efforts shall fall into the protection scope of the present disclosure.

Figure 1:
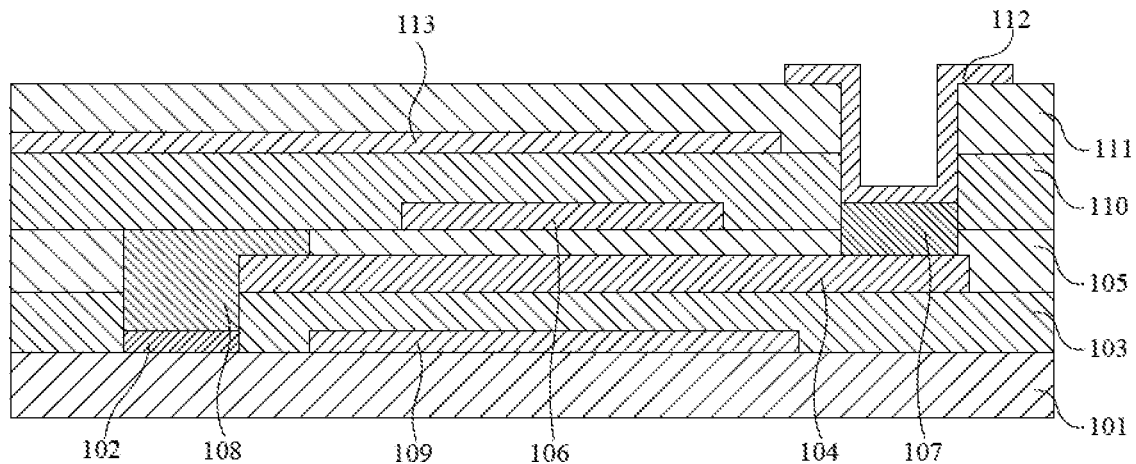
FIG. 1 is a schematic structural view of an embodiment of an array substrate provided by the present disclosure.

Referring to FIG. 1, FIG. 1 is a schematic structural view of an embodiment of an array substrate provided by the present disclosure. The array substrate of the present embodiment may include a base substrate 101, a source pattern layer 102, a buffer layer 103, a semiconductor pattern layer 104, a gate insulating layer 105, a gate pattern layer 106, a drain pattern layer 107, and a connection pattern layer 108.

Figure 2:
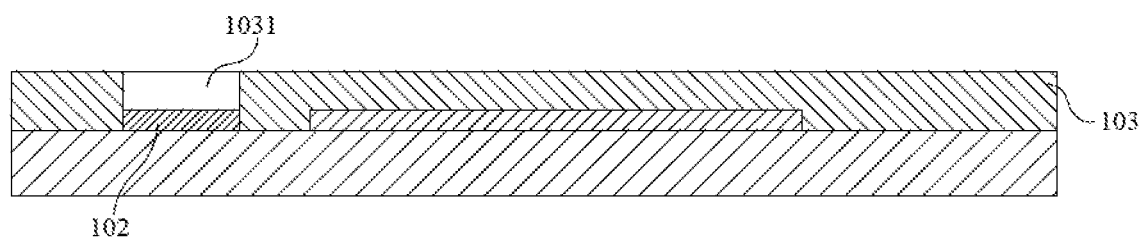
FIG. 2 is a schematic structural view of forming a base substrate, a source pattern layer, and a buffer layer in FIG. 1.

Referring to FIG. 1 and FIG. 2, the base substrate 101 may be, but not limited to, a glass substrate, a ceramic substrate, and a silicon wafer substrate.

The source pattern layer 102 may be formed on the base substrate 101.

The buffer layer 103 may be formed on the base substrate 101 and may cover the source pattern layer 102, wherein the buffer layer 103 may be an insulating layer made of silicon nitride and/or silicon oxide.

The buffer layer 103 may define a first via hole 1031 through which the source pattern layer 102 is exposed.

Figure 3:
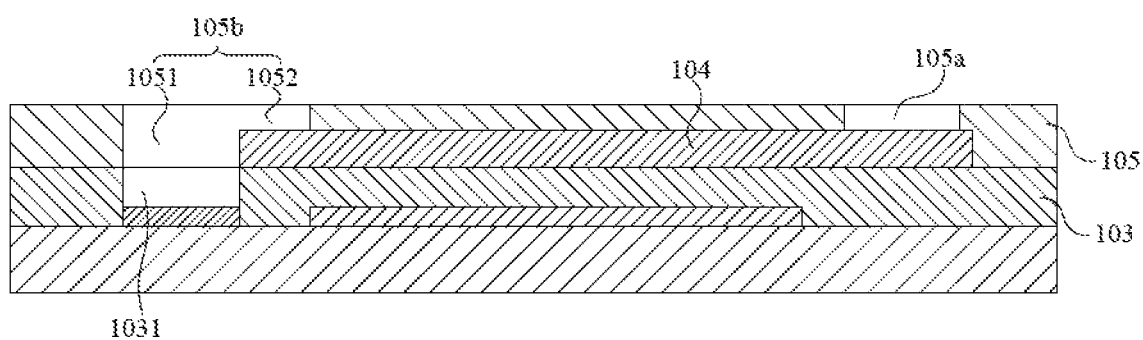
FIG. 3 is a schematic structural view of forming a semiconductor pattern layer and a gate insulating layer in FIG. 1.

Referring to FIG. 2 and FIG. 3, the semiconductor pattern layer 104 may be formed on the buffer layer 103.

Alternatively, the semiconductor pattern layer 104 may be a doped polysilicon layer.

The gate insulating layer 105 may be formed on the buffer layer 103 and may cover the semiconductor pattern layer 104.

The gate insulating layer 105 may define a second via hole 105a and a third via hole 105b. One end of the semiconductor pattern layer 104 may be exposed through the second via hole 105a, the third via hole 105b may be connected to the first via hole 1031 and the other end of the semiconductor pattern layer 104 may be exposed through the third via hole 105b.

The third via hole 105b may be divided into a first hole segment 1051 and a second hole segment 1052. The first hole segment 1051 may be disposed corresponding to the first via hole 1031 and may be connected to the first via hole 1031, and the second hole segment 1052 may be disposed corresponding to the other end of the semiconductor pattern layer 104 and the other end of the semiconductor pattern layer 104 may be exposed through the second hole segment 1052.

Figure 4:
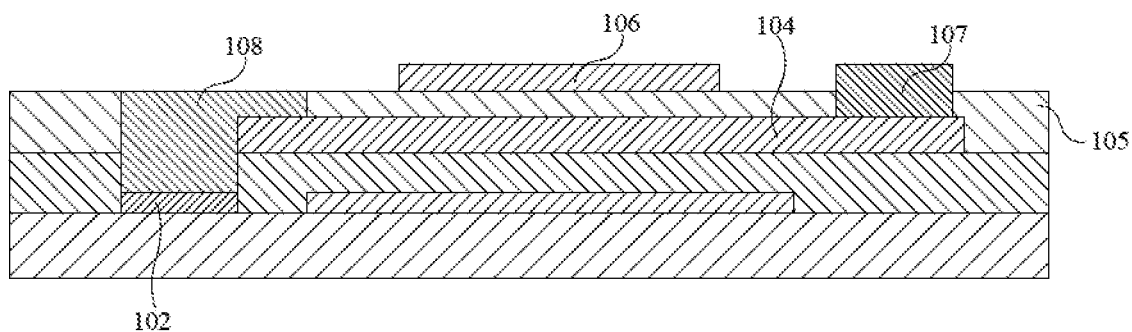
FIG. 4 is a schematic structural view of forming a gate insulating layer, a drain pattern layer, and a connection pattern layer in FIG. 1.

Referring to FIG. 3 and FIG. 4, the gate pattern layer 106, the drain pattern layer 107, and the connection pattern layer 108 may be formed on the gate insulating layer 105, and may be spaced apart from each other.

The drain pattern layer 107 may be connected to one end of the semiconductor pattern layer 104 through the second via hole 105a, and the connection pattern layer 108 may be filled in the first via hole 1031 and the third via hole 105b to connect the source pattern layer 102 and the other end of the semiconductor pattern layer 104.

Further referring to FIG. 1, the array substrate of the present embodiment may also include a light shielding layer 109 formed on the base substrate 101 and disposed corresponding to the semiconductor pattern layer 104.

The light shielding layer 109 may be a metal light shielding layer, and the metal light shielding layer may be spaced apart from the source pattern layer 102.

Furthermore, the array substrate of the embodiment may also include a protective layer 110, a planar layer 111, and a pixel electrode layer 112, which may be sequentially formed.

Figure 5:
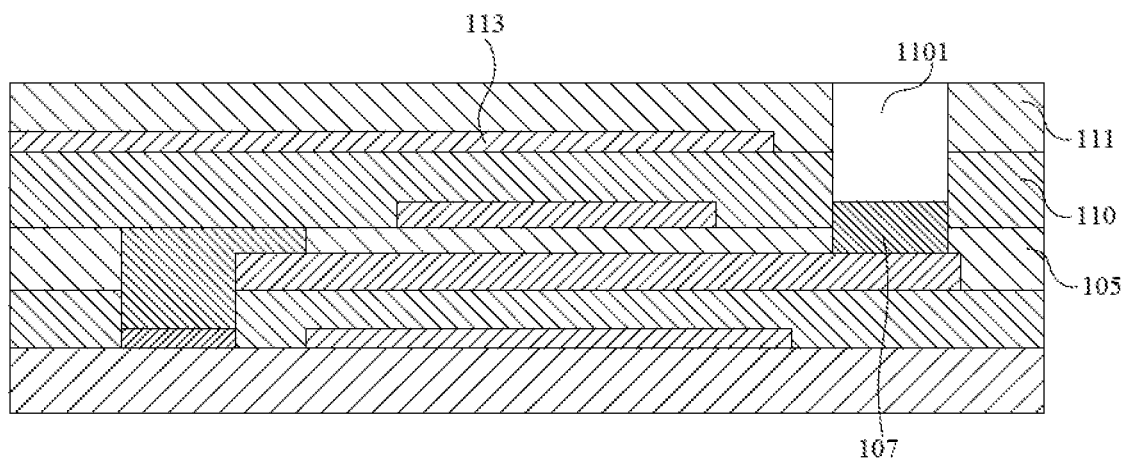
FIG. 5 is a schematic structural view of forming a protective layer and a planar layer in FIG. 1.

Referring to FIG. 1 and FIG. 5, the protective layer 110 may be formed on the gate insulating layer 105 and may cover the gate pattern layer 106, the drain pattern layer 107, and the connection pattern layer 108.

A common electrode layer 113 may be formed on the protective layer 110, and the planar layer 111 may be formed on the protective layer 110 and may cover the common electrode layer 113.

The protective layer 110 and the planar layer 111 may define a fourth via hole 1101 through which the drain pattern layer 107 is exposed, and the fourth via hole 1101 may be connected to the second via hole 105a.

The pixel electrode layer 112 may be formed on the planar layer 111, and may be connected to the drain pattern layer 107 through the fourth via hole 1101.

Figure 6:
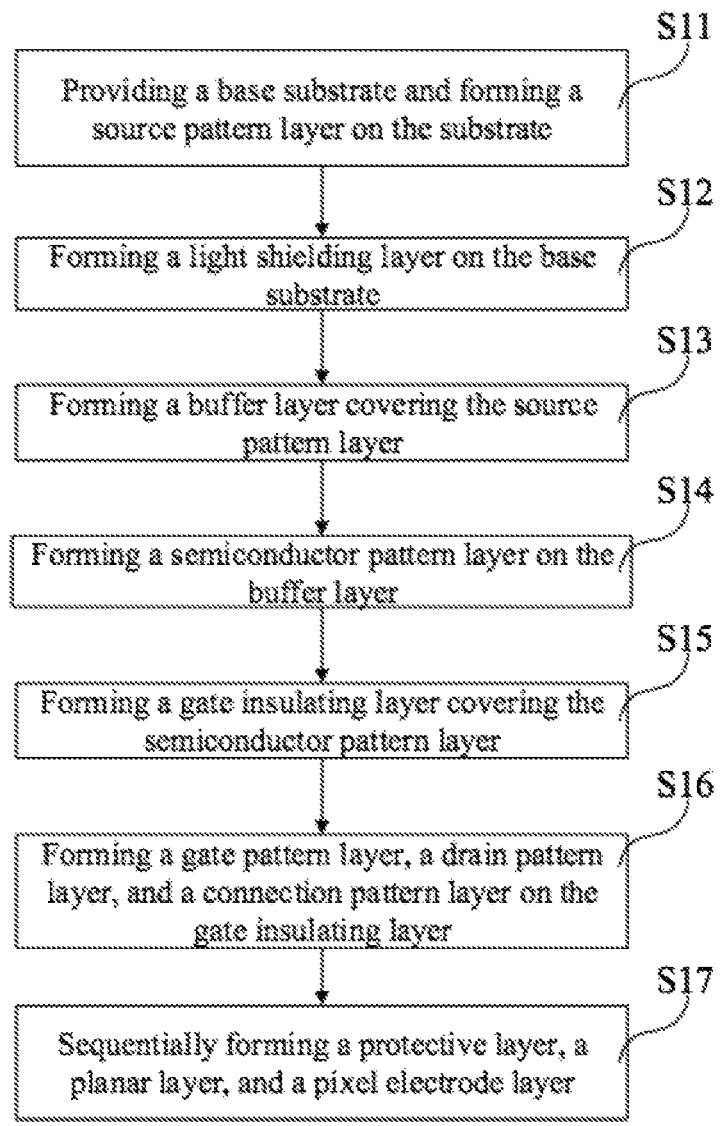
FIG. 6 is a schematic flow chart of an embodiment of a manufacturing method of an array substrate provided by the present disclosure.

Referring to FIG. 6, FIG. 6 is a schematic flowchart of an embodiment of a manufacturing method of the array substrate provided by the present disclosure. The method of this embodiment may specifically include following blocks.

In S11, the method may include providing a base substrate and forming a source pattern layer on the substrate.

Referring to FIG. 1 and FIG. 2, a substrate 101 may be, but not limited to, a glass substrate, a ceramic substrate, and a silicon wafer substrate, may be provided. After the substrate 101 is cleaned, metal may be deposited on the substrate 101 to form a metal layer, and then the metal layer may be patterned by a photolithography process of photoresist coating, exposure, development, etching, and lift-off, and the patterned metal layer may be regarded as the source pattern layer 102 in this embodiment.

Alternatively, the metal includes, but not limited to, molybdenum, aluminum or copper.

In S12, the method may include forming a light shielding layer on the base substrate.

The light shielding layer 109 may be a metal light shielding layer. Specifically, a metal layer may be formed through depositing metal on the base substrate 101, then the metal layer may be patterned by a photolithography process of photoresist coating, exposure, development, etching, and lift-off, the patterned metal layer may be spaced apart from the source pattern layer 102, and the patterned metal layer may be the light shielding layer 109 in the present embodiment.

It can be understood that the metal used to form the light shielding layer 109 in the block S12 may be different from the metal used to form the source pattern layer 102 in the above block S11.

Alternatively, the block S12 may be performed before the step S11, that is, the sequence between the step S11 and the step S12 is not limited.

In S13, the method may include forming a buffer layer covering the source pattern layer.

Specifically, an insulating material of silicon oxide and/or silicon nitride may be deposited on the base substrate 101 to cover the source pattern layer 102 and the light shielding layer 109, through a physical vapor deposition method or a plasma vapor deposition method, so as to form an insulating layer to be the buffer layer 103.

The buffer layer 103 may define a first via hole 1031 through which the source pattern layer 102 is exposed.

Specifically, after the insulating material is deposited to form the insulating layer, the first via hole 1031., through which the source pattern layer 102 is exposed, may be formed on the insulating layer through a photolithography process of photoresist coating, exposure, development, etching, and lift-off.

In S14, the method may include forming a semiconductor pattern layer on the buffer layer.

Referring to FIG. 2 and FIG. 3, amorphous silicon may be deposited on the buffer layer 103, and amorphous silicon may be converted into polysilicon by a crystallization process to form a semiconductor layer, then through a photolithography process of photoresist coating, exposure, development, etching, and lift-off, the semiconductor layer may be patterned, and the patterned semiconductor layer may be ion doped, to form the semiconductor pattern layer 104.

The semiconductor pattern layer 104 may be disposed corresponding to the light shielding layer 109.

In S15, the method may include forming a gate insulating layer covering the semiconductor pattern layer.

Specifically, silicon nitride and/or silicon oxide may be deposited on the buffer layer 103 to form a gate insulating layer 105 through a physical vapor deposition method or a chemical vapor deposition method.

The gate insulating layer 105 may define a second via hole 105a and a third via hole 105b. One end of the semiconductor pattern layer 104 may be exposed through the second via hole 105a, the third via hole 105b may connect to the first via hole 1031, and the other end of the semiconductor pattern layer 104 may be exposed through the third via hole 105b.

Specifically, after the gate insulating layer 105 is formed, through a photolithography process of photoresist coating, exposure, development, etching, and lift-off, the second via hole 105a through which one end of the semiconductor pattern layer 104 is exposed, may be formed on the gate insulating layer 105, and a third via hole 1031 connecting to the first via hole 1031 and through which the other end of the semiconductor pattern layer 104 is exposed, may be formed on the gate insulating layer 105.

The third via hole 105b may include a first hole segment 1051 and a second hole segment 1052. The first hole segment 1051 may be disposed corresponding to the first via hole 1031 and may be connected to the first via hole 1031, and the second hole segment 1052 may be disposed corresponding to the other end of the semiconductor pattern layer 104 and the other end of the semiconductor pattern layer 104 may be exposed through the second hole segment 1052.

In S16, the method may include forming a gate pattern layer, a drain pattern layer, and a connection pattern layer on the gate insulating layer.

Referring to FIG. 3 and FIG. 4, a metal may be deposited on the gate insulating layer 105 and in the first via hole 1031, the second via hole 105a, and the third via hole 105b, to form a metal layer, and then the metal layer may be processed through a photolithography process of photoresist coating, exposure, development, etching, and lift-off to form the gate pattern layer 106, the drain pattern layer 107, and the connection pattern layer 108. The drain pattern layer 107 may be connected to one end of the semiconductor pattern layer 104 through the second via hole 105a, and the connection pattern layer 108 may be filled in the first via hole 1031 and the third via hole 105b to connect the source pattern layer 102 and the other end of the semiconductor pattern layer 104.

Further referring to FIG. 6, the manufacturing method of this embodiment may further include following blocks.

In S17, the method may include sequentially forming a protective layer, a planar layer, and a pixel electrode layer.

Referring to FIG. 1 and FIG. 5, the protective layer 110 may be formed on the gate insulating layer 105 by a physical vapor deposition method or a plasma vapor deposition method, and the protective layer 110 may cover the gate pattern layer 106, the drain pattern layer 107 and the connecting the pattern layer 108, and a planar layer 111 may be formed on the protective layer 110 by a physical vapor deposition method or a plasma vapor deposition method.

The protective layer 110 and the planar layer 111 may define a fourth via hole 1101 through which the drain pattern layer 107 is exposed, the fourth via hole 1101 may be connected to the second via hole 105a, and the pixel electrode layer 112 may be connected to the drain pattern layer 107 through the fourth via hole 1101.

Specifically, after the planar layer 111 is formed, the fourth via hole 1101 through which the drain pattern layer 107 is exposed, may be formed by a photolithography process of photoresist coating, exposure, development, etching, and lift-off, and then the pixel electrode layer 112 may be formed on the planar layer 111 and in the fourth via hole 1101 such that the pixel electrode layer 112 may be connected to the drain pattern layer 107 through the fourth via hole 1101.

The present disclosure also provides a display including the array substrate in the above embodiment.

Differing from the prior art, in the present disclosure, with a source pattern layer formed on a base substrate, and through the connection pattern layer filled in the first via hole of the buffer layer and the third via hole of the gate insulating layer, the source pattern layer may be connected with a semiconductor pattern layer disposed on the buffer layer, such that the source pattern layer crossing the gate pattern layer may be insulated from the gate pattern layer through the insulating buffer layer, in which case, the dielectric layer in the prior art which is formed to insulate the source pattern layer and the gate pattern layer, may be eliminated, thus simplifying the structure of the array substrate, and reducing the process steps and process costs.

The above description depicts merely some exemplary embodiments of the disclosure, but is not meant to limit the scope of the disclosure. Any equivalent structure or flow transformations made according to the disclosure, or any direct or indirect applications of the disclosure on other related fields, shall all fall into the protection scope of the disclosure.

What is claimed is:

1. A display device, comprising an array substrate, the array substrate comprising:
   a base substrate, and a source pattern layer and a light shielding layer formed on the base substrate;
   a buffer layer covering the source pattern layer, the buffer layer defining a first via hole through which the source pattern layer is exposed;
   a semiconductor pattern layer formed on the buffer layer, the semiconductor pattern layer overlapping with a projection of the light shielding layer along a direction perpendicular to a contact surface of the light shielding layer, wherein the contact surface is in contact with the buffer layer;
   a gate insulating layer covering the semiconductor pattern layer, the gate insulating layer defining a second via hole and a third via hole, one end of the semiconductor pattern layer exposed through the second via hole, the third via hole connected to the first via hole, and the other end of the semiconductor pattern layer exposed through the third via hole;
   a gate pattern layer, a drain pattern layer, and a connection pattern layer formed on the gate insulating layer, the drain pattern layer connected to one end of the semiconductor pattern layer through the second via hole, the connection pattern layer filled in the first via hole and the third via hole to connect the source pattern layer with the other end of the semiconductor pattern layer; and
   a protective layer, a planar layer, and a pixel electrode layer, which are sequentially formed, the protective layer formed on the gate insulating layer and covering the gate pattern layer, the drain pattern layer, and the connection pattern layer, and the protective layer is in directly contact with the gate pattern layer, the drain pattern layer and the connection pattern layer, the protective layer and the planar layer defining a fourth via hole through which the drain pattern layer is exposed, the fourth via hole connected with the second via hole, and the pixel electrode layer connected to the drain pattern layer through the fourth via hole.

2. The display device according to claim 1, wherein a common electrode layer is formed on the protective layer, and the planar layer is formed on the protective layer and covers the common electrode layer.

3. The display device according to claim 1, wherein the light shielding layer is a metal light shielding layer, and the metal light shielding layer is spaced apart from the source pattern layer.

4. The display device according to claim 1, wherein the third via hole is divided into a first hole segment and a second hole segment, the first hole segment overlaps with a projection of the first via hole along a direction perpendicular to a surface of the via hole, and the first hole segment is connected to the first via hole, the second hole segment overlaps with a projection of the other end of the semiconductor pattern layer along a direction perpendicular to a surface of the other end of the semiconductor pattern layer, and the other end of the semiconductor pattern layer is exposed through the second hole segment.

5. The display device according to claim 1, wherein the base substrate is a glass substrate, a ceramic substrate, or a silicon wafer substrate.

6. The display device according to claim 1, wherein the buffer layer is an insulating layer made of silicon nitride and/or silicon oxide.

7. An array substrate, comprising:
   a base substrate, and a source pattern layer formed on the base substrate;
   a buffer layer covering the source pattern layer, the buffer layer defining a first via hole through which the source pattern layer is exposed;
   a semiconductor pattern layer formed on the buffer layer;
   a gate insulating layer covering the semiconductor pattern layer, the gate insulating layer defining a second via hole and a third via hole, the second via hole and the third via hole penetrating the gate insulating layer, one end of the semiconductor pattern layer exposed through the second via hole, the third via hole connected to the first via hole, and the other end of the semiconductor pattern layer exposed through the third via hole; and
   a gate pattern layer, a drain pattern layer, and a connection pattern layer formed on the gate insulating layer, the drain pattern layer connected to one end of the semiconductor pattern layer through the second via hole, the connection pattern layer filled in the first via hole and the third via hole to connect the source pattern layer with the other end of the semiconductor pattern layer.

8. The array substrate according to claim 7, further comprising:
   a protective layer, a planar layer, and a pixel electrode layer, which are sequentially formed, the protective layer and the planar layer defining a fourth via hole through which the drain pattern layer is exposed, the fourth via hole connected with the second via hole, and the pixel electrode layer connected to the drain pattern layer through the fourth via hole.

9. The array substrate according to claim 8, wherein a common electrode layer is formed on the protective layer, and the planar layer is formed on the protective layer and covers the common electrode layer.

10. The array substrate according to claim 7, wherein a light shielding layer is formed on the base substrate, and the light shielding layer overlaps with a projection of the semiconductor pattern layer along a direction perpendicular to a contact surface of the semiconductor pattern layer, wherein the contact surface is in contact with the buffer layer.

11. The array substrate according to claim 10, wherein the light shielding layer is a metal light shielding layer, and the metal light shielding layer is spaced apart from the source pattern layer.

12. The array substrate according to claim 7, wherein the third via hole is divided into a first hole segment and a second hole segment, the first hole segment overlaps with a projection of the first via hole along a direction perpendicular to a surface of the via hole, and the first hole segment is connected to the first via hole, the second hole segment overlaps with a projection of the other end of the semiconductor pattern layer along a direction perpendicular to a surface of the other end of the semiconductor pattern layer, and the other end of the semiconductor pattern layer is exposed through the second hole segment.

13. The array substrate according to claim 7, wherein the base substrate is a glass substrate, a ceramic substrate, or a silicon wafer substrate.

14. The array substrate according to claim 7, wherein the buffer layer is an insulating layer made of silicon nitride and/or silicon oxide.

* * * * *